United States Patent
Chen et al.

(10) Patent No.: US 10,709,010 B1
(45) Date of Patent: Jul. 7, 2020

(54) FLEXIBLE PRINTED CIRCUIT AND DISPLAY MODULE HAVING FLEXIBLE PRINTED CIRCUIT

(71) Applicant: HIMAX TECHNOLOGIES LIMITED, Tainan (TW)

(72) Inventors: Peng-Chi Chen, Tainan (TW);
Kuan-Hung Lin, Tainan (TW);
Mong-Hua Tu, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 16/439,677

(22) Filed: Jun. 12, 2019

(51) Int. Cl.
H05K 1/02 (2006.01)
H05K 1/11 (2006.01)
H05K 1/18 (2006.01)

(52) U.S. Cl.
CPC .......... H05K 1/0216 (2013.01); H05K 1/118 (2013.01); H05K 1/189 (2013.01); H05K 2201/09254 (2013.01); H05K 2201/10128 (2013.01)

(58) Field of Classification Search
CPC ...... H05K 1/0216; H05K 1/118; H05K 1/189; H05K 2201/09254; H05K 2201/10128
See application file for complete search history.

(56) References Cited

U.S. PATENT DOCUMENTS

| | | | | |
|---|---|---|---|---|
| 5,717,556 A | * | 2/1998 | Yanagida | H05K 1/0278 174/254 |
| 6,060,770 A | * | 5/2000 | Nakamura | H01L 23/49572 257/668 |
| 7,439,449 B1 | * | 10/2008 | Kumar | G02B 6/4292 174/254 |
| 9,414,533 B2 | * | 8/2016 | Yanagihara | H05K 9/00 |
| 2007/0109759 A1 | * | 5/2007 | Torii | H05K 1/0271 361/777 |
| 2009/0115054 A1 | * | 5/2009 | Hashimoto | H01L 24/11 257/737 |
| 2012/0134122 A1 | * | 5/2012 | Kim | H05K 1/189 361/749 |
| 2016/0071798 A1 | * | 3/2016 | Komiya | H01L 23/5386 257/499 |
| 2018/0315776 A1 | * | 11/2018 | Chuang | G02F 1/1303 |
| 2020/0037434 A1 | * | 1/2020 | Ueda | H05K 1/028 |

FOREIGN PATENT DOCUMENTS

| | | |
|---|---|---|
| CN | 101900894 A | 12/2010 |
| CN | 203554794 U | 4/2014 |
| TW | 201008477 | 2/2010 |
| WO | 2017/201788 A1 | 11/2017 |

* cited by examiner

Primary Examiner — Hoa C Nguyen
(74) Attorney, Agent, or Firm — Winston Hsu

(57) ABSTRACT

The present invention provides a flexible printed circuit, wherein the flexible printed circuit includes a substrate, a plurality of first terminals on the substrate, a plurality of second terminals on the substrate and a plurality of traces on the substrate. The plurality of traces is arranged for electrically connecting the plurality of first terminals to the plurality of second terminals, wherein the plurality of traces include at least one specific trace, the specific trace electrically connects a specific first terminal of the first terminals to two specific second terminals of the second terminals, the specific trace divides into two sub-traces at an increasing point, and a distance between the increasing point and the two specific second terminals are less than 5 mm.

17 Claims, 3 Drawing Sheets

FLEXIBLE PRINTED CIRCUIT AND DISPLAY MODULE HAVING FLEXIBLE PRINTED CIRCUIT

BACKGROUND OF THE INVENTION

1. Field of the Invention

The present invention relates to a flexible printed circuit, and more particularly, to a trace design of the flexible printed circuit.

2. Description of the Prior Art

When a cell phone communicating with one electronic device is close to a display panel, especially the cell phone is put on the display panel, the image displayed on the display panel may be interfered and the image may be distorted or abnormal, causing the inconvenient to the user.

SUMMARY OF THE INVENTION

It is therefore an objective of the present invention to provide a flexible printed circuit design in the display panel, which can avoid or mitigate the interference from the cell phone, to solve the above-mentioned problems.

According to one embodiment of the present invention, a flexible printed circuit comprises a substrate, a plurality of first terminals on the substrate, a plurality of second terminals on the substrate and a plurality of traces on the substrate. The plurality of traces is arranged for electrically connecting the plurality of first terminals to the plurality of second terminals, wherein the plurality of traces comprise at least one specific trace, the specific trace electrically connects a specific first terminal of the first terminals to two specific second terminals of the second terminals, the specific trace divides into two sub-traces at an increasing point, and a distance between the increasing point and the two specific second terminals are less than 5 millimeter (mm).

According to another embodiment of the present invention, a display module comprises a printed circuit board having a plurality of components mounted thereon, a display panel having a glass substrate, and a flexible printed circuit. The flexible printed circuit comprises a substrate, a plurality of first terminals on the substrate, a plurality of second terminals on the substrate and a plurality of traces on the substrate, wherein the first terminals are bonded to the printed circuit board, and the second terminals are bonded to the glass substrate of the display panel. The plurality of traces is arranged for electrically connecting the plurality of first terminals to the plurality of second terminals, wherein the plurality of traces comprise at least one specific trace, the specific trace electrically connects a specific first terminal of the first terminals to two specific second terminals of the second terminals, the specific trace divides into two sub-traces at an increasing point, and a distance between the increasing point and the two specific second terminals are less than 5 mm.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
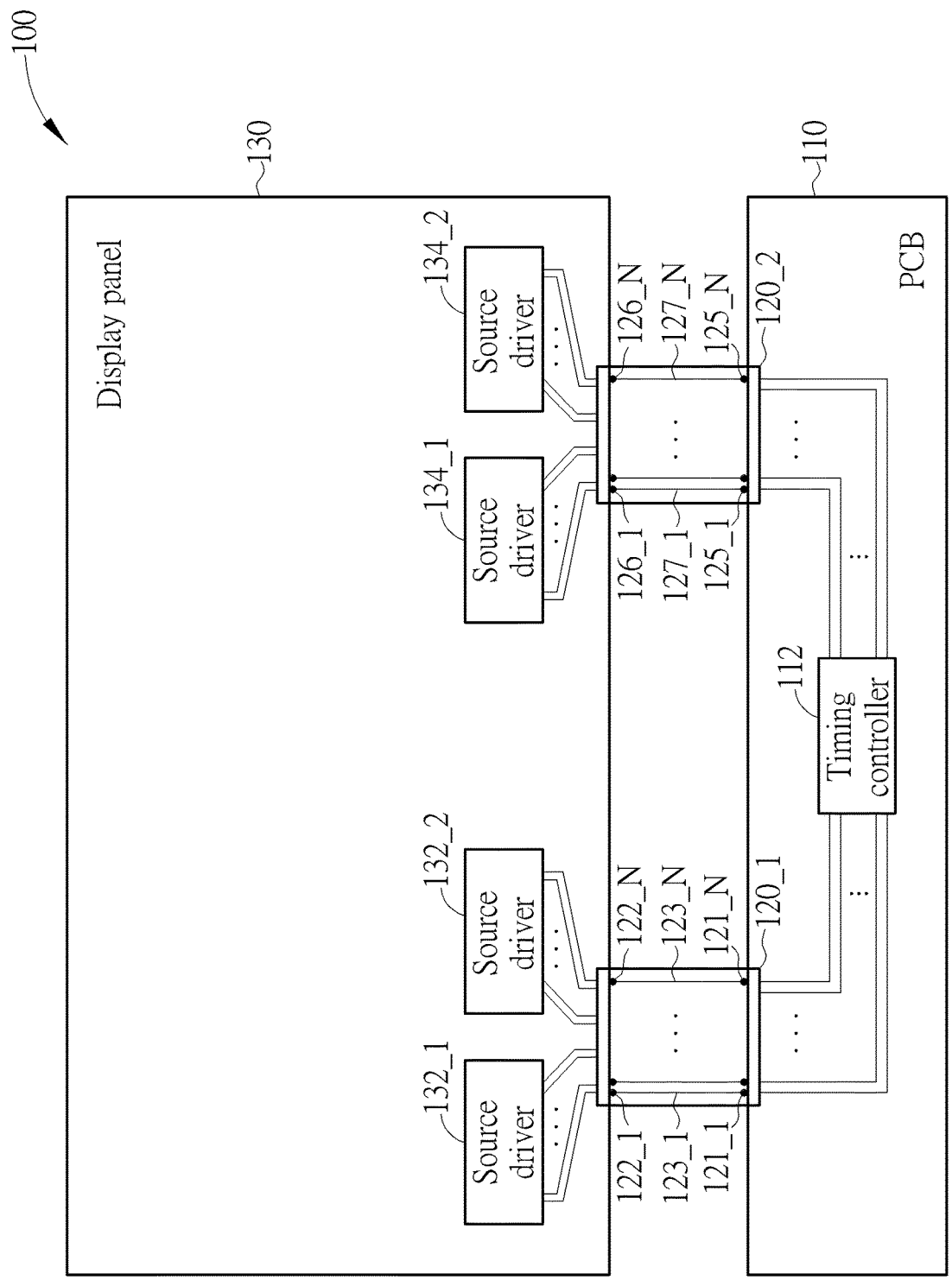
FIG. 1 is a diagram illustrating a display module according to one embodiment of the present invention.

FIG. 1 is a diagram illustrating a display module 100 according to one embodiment of the present invention. As shown in FIG. 1, the display module 100 comprises a printed circuit board (PCB) 110, at least one flexible printed circuit (FPC) (two FPCs 120_1-120_2 in this embodiment) and a display panel 130. In this embodiment, the PCB 110 comprises a plurality of components comprising a timing controller 112 mounted thereon; the FPC 120_1 comprises a substrate and a plurality of traces 123_1-123_N, and the traces 123_1-123_N have a plurality of first terminals 121_1-121_N and a plurality of second terminals 122-1-122_N on the substrate; the FPC 120_2 comprises a substrate and a plurality of traces 127_1-127_N, and the traces 127_1-127_N have a plurality of first terminals 125_1-125_N and a plurality of second terminals 126-1-126_N on the substrate; the display panel comprises a glass substrate and a plurality of source drivers 132_1, 132_2, 134_1 and 134_2 mounted on the glass substrate.

In this embodiment, the FPC 120_1 is arranged to transmit the signals from the PCB 110 to the source drivers 132_2-132_2 via the first terminals 121_1-121_N, the traces 123_1-123_N and the second terminals 122-1-122_N, and the FPC 120_2 is arranged to transmit the signals from the PCB 110 to the source drivers 134_2-134_2 via the first terminals 125_1-125_N, the traces 127_1-127_N and the second terminals 126-1-126_N. Because the present invention focuses on the trace design of the FPC 120_1 and 120_2, and the functions of the timing controller 112 and the source drivers 132_1, 132_2, 134_1 and 134_2 are known by a person skilled in the art, further descriptions about the components on the PCB 110 and the display panel 130 are therefore omitted here.

Figure 2:
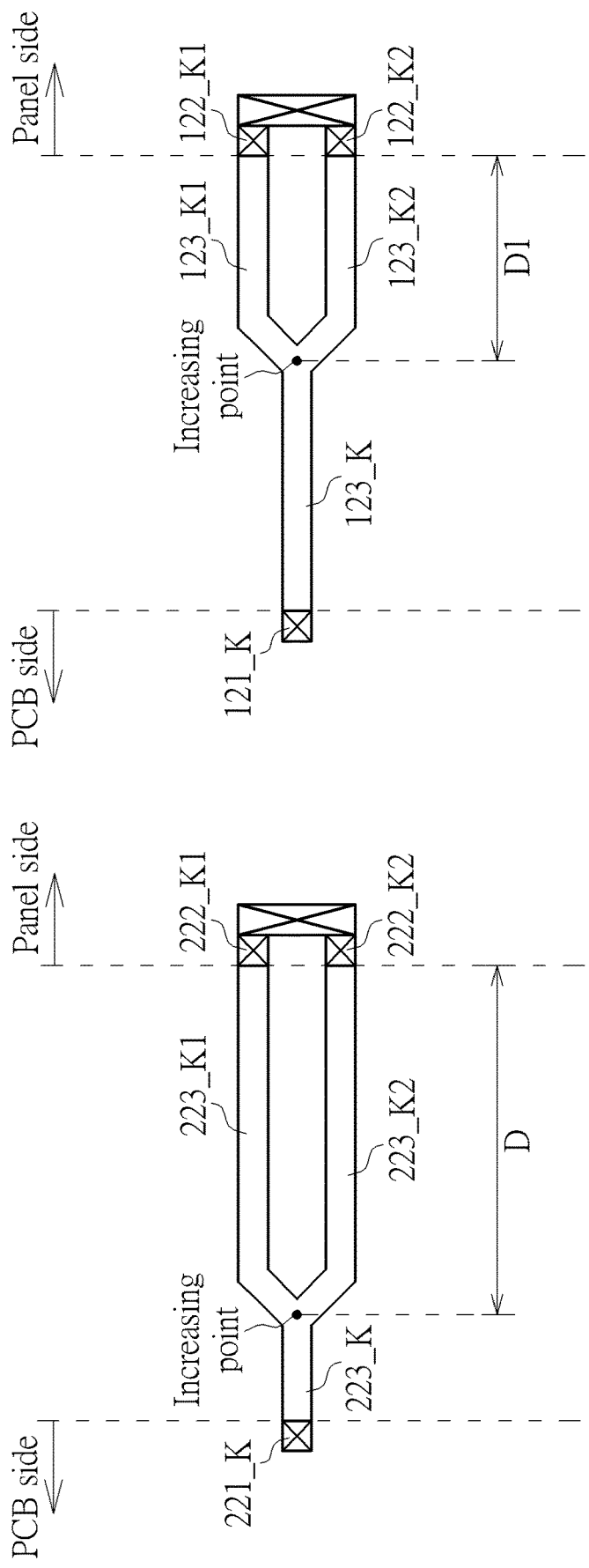
FIG. 2 shows the prior art specific trace design and the specific trace design of the embodiment of the present invention.

As described in the background of the invention, the display panel may suffer interference when a cell phone is close to the display panel. In order to find a root cause, the inventor uses a signal generator and H-probe to find weak points on the FPC, where the weak point is a critical structure that receives electromagnetic wave (noise). After scanning the FPC, the inventor finds that the weak point is a specific trace that is divided into two sub-traces at an increasing point, and it may serve as a loop antenna to receive the RF signals (i.e. noise) from the cell phone, and the signals carried on this specific trace may be interfered. In detail, refer to FIG. 2, the prior art FPC comprises at least one specific trace 223_K, the specific trace 223_K comprise a first terminal 221_K bonded on the PCB, the specific trace 223_K is divided into two sub-traces 223_K1 and 223_K2 at an increasing point, and the sub-traces 223_K1 and 223_K2 have second terminals 222_K1 and 222_K2 bonded on the display panel, respectively. The reason to design the two sub-traces 223_K1 and 223_K2 is because a glass substrate of the display panel 130 has higher impedance, and the trace on the glass substrate is designed wider for transmitting the signal required to have higher quality. In the prior art, a distance D from the increasing point to the second terminals 222_K1 and 222_K2 (i.e. the edge of the display panel) is always designed large, for example the distance D is ranging from 10 mm-15 mm. However, the structure from the increasing point to the second terminals 222_K1 and 222_K2 shown in FIG. 2 looks like the loop antenna (note, the second terminals 222_K1 and 222_K2 are combined together at the display panel), and this structure easily receives the noise.

In order to solve this problem, the FPC 120_1/120_2 is/are designed to have a smaller loop antenna to lower the received noise. Taking FIG. 2 as an example, the FPC 120_1/120_2 comprises at least one specific trace 123_K, the specific trace 123_K comprise a first terminal 121_K bonded on the PCB 110, the specific trace 123_K is divided into two sub-traces 123_K1 and 123_K2 at the increasing point, and the sub-traces 123_K1 and 123_K2 have second terminals 122_K1 and 122_K2 bonded on the display panel 130, respectively. In this embodiment, a distance D1 from the increasing point to the second terminals 122_K1 and 122_K2 (i.e. the edge of the display panel 130) is designed shorter to shrink the loop size, for example the distance D1 can be less than 5 mm. In light of above, because the loop size is smaller, the noise received by the loop structure is lowered and the signal quality carried on the specific trace 123_K can be improved.

In one embodiment, the FPC 120_1/120_2 may have many specific traces that have two more sub-traces, and only a portion of the specific traces is/are designed to have the distance D1 less than 5 mm. In another embodiment of the present invention, all of the specific traces on the FPC 120_1/120_2 are designed to have the distance D1 less than 5 mm. These alternative designs shall fall within the scope of the present invention.

In one embodiment, the distance D1 can be less than 1 mm to reduce the interference more, and only a portion of the specific traces on the FPC 120_1/120_2 is/are designed to have the distance D1 less than 1 mm. In another embodiment of the present invention, all of the specific traces on the FPC 120_1/120_2 are designed to have the distance D1 less than 1 mm. These alternative designs shall fall within the scope of the present invention.

It is noted that the distance D1 is intentionally designed shorter, and the FPC 120_1/120_2 may have enough space to have the greater distance D1. Specifically, the increasing point of the specific trace 123_K may be allowed to move to the left such as the prior art specific trace 223_K, without influencing/moving other traces.

Figure 3:
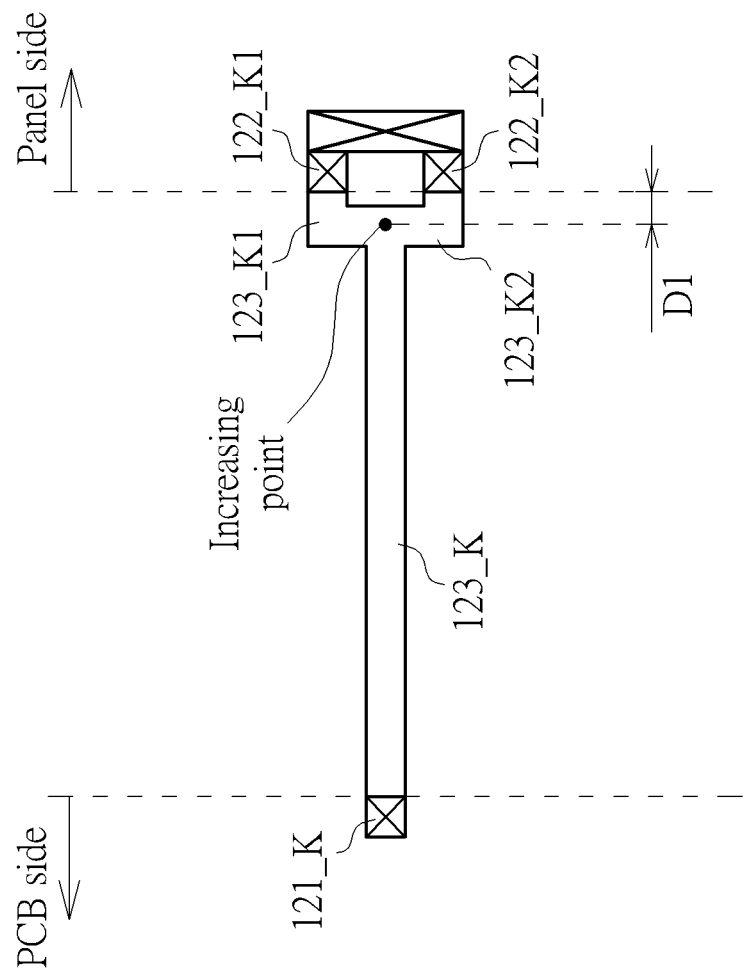
FIG. 3 is a diagram illustrating the specific trace design according to one embodiment of the present invention.

In one embodiment, to further shrink the loop structure, the specific trace 123_K may be divided into two sub-traces 123_K1 and 123_K2 at the edge of the display panel 130 as shown in FIG. 3, that is the distance between the increasing point and the second terminals 122_K1 and 122_K2 is as smaller as possible. For example, in the current process limit, the distance D1 between the increasing point and the second terminals 122_K1 and 122_K2 may be 0.4 mm. If the process progresses in the future, the distance D1 may be smaller than 0.4 mm. In addition, in a first example, only a portion of the specific traces on the FPC 120_1/120_2 is/are designed to have the distance D1 as smaller as possible. In another example, all of the specific traces on the FPC 120_1/120_2 are designed to have the distance D1 as smaller as possible. These alternative designs shall fall within the scope of the present invention.

Briefly summarized, in the FPC and associated display module of the present invention, the specific trace that is divided into two or more sub-traces is designed to have a smaller distance between the increasing point and the edge of the display panel. By using the specific trace design of the embodiments of the present invention, the loop size of the specific trace is shrunk, and the noise received by the specific trace is much less than the prior art specific trace, and the signal quality carried on the specific trace can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flexible printed circuit, comprising:
   a substrate;
   a plurality of first terminals on the substrate;
   a plurality of second terminals on the substrate;
   a plurality of traces on the substrate, for electrically connecting the plurality of first terminals to the plurality of second terminals, wherein the plurality of traces comprise at least one specific trace, the specific trace electrically connects a specific first terminal of the first terminals to two specific second terminals of the second terminals, the specific trace divides into two sub-traces at an increasing point, and a distance between the increasing point and the two specific second terminals are less than 5 millimeter (mm).

2. The flexible printed circuit of claim 1, wherein the distance between the increasing point and the two specific second terminals are less than 1 mm.

3. The flexible printed circuit of claim 2, wherein the increasing point is at edges of the two specific second terminals.

4. The flexible printed circuit of claim 1, wherein for each of the traces having the increasing point connecting to two second terminals on the substrate, the distance between the increasing point and the two second terminals are less than 5 mm.

5. The flexible printed circuit of claim 4, wherein for each of the traces having the increasing point connecting to the two second terminals on the substrate, the distance between the increasing point and the two second terminals are less than 1 mm.

6. The flexible printed circuit of claim 5, wherein for each of the traces having the increasing point connecting to the two second terminals on the substrate, the increasing point is at the edges of the two second terminals.

7. The flexible printed circuit of claim 1, wherein the substrate have enough space for the specific trace to have a greater distance between the increasing point and the two specific second terminals.

8. The flexible printed circuit of claim 7, wherein the substrate have enough space for the specific trace to have the distance between the increasing point and the two specific second terminals greater than 10 mm.

9. The flexible printed circuit of claim 1, wherein the plurality of first terminals are arranged to be bonded on a printed circuit board, and the plurality of second terminals are bonded to a glass substrate of a panel.

10. A display module, comprising:
    a printed circuit board having a plurality of components mounted thereon;
    a display panel having a glass substrate; and
    a flexible printed circuit, comprising:
      a substrate;
      a plurality of first terminals on the substrate, wherein the first terminals are bonded to the printed circuit board;

a plurality of second terminals on the substrate, wherein the second terminals are bonded to the glass substrate of the display panel;

a plurality of traces on the substrate, for electrically connecting the plurality of first terminals to the plurality of second terminals, wherein the plurality of traces comprise at least one specific trace, the specific trace electrically connects a specific first terminal of the first terminals to two specific second terminals of the second terminals, the specific trace divides into two sub-traces at an increasing point, and a distance between the increasing point and the two specific second terminals are less than 5 millimeter (mm).

11. The display module of claim 10, wherein the distance between the increasing point and the two specific second terminals are less than 1 mm.

12. The display module of claim 11, wherein the increasing point is at edges of the two specific second terminals.

13. The display module of claim 10, wherein for each of the traces having the increasing point connecting to two second terminals on the substrate, the distance between the increasing point and the two second terminals are less than 5 mm.

14. The display module of claim 13, wherein for each of the traces having the increasing point connecting to the two second terminals on the substrate, the distance between the increasing point and the two second terminals are less than 1 mm.

15. The display module of claim 14, wherein for each of the traces having the increasing point connecting to the two second terminals on the substrate, the increasing point is at the edges of the two second terminals.

16. The display module of claim 10, wherein the substrate have enough space for the specific trace to have a greater distance between the increasing point and the two specific second terminals.

17. The display module of claim 16, wherein the substrate have enough space for the specific trace to have the distance between the increasing point and the two specific second terminals greater than 10 mm.

\* \* \* \* \*